(12) United States Patent  
Wang

(10) Patent No.: US 10,763,637 B2  
(45) Date of Patent: Sep. 1, 2020

(54) OPTICAL SIGNAL GENERATION DEVICE AND METHOD AND CHIP

(71) Applicant: Huawei Technologies Co., Ltd., Shenzhen, Guangdong (CN)

(72) Inventor: Yin Wang, Shenzhen (CN)

(73) Assignee: HUAWEI TECHNOLOGIES CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 16/157,807

(22) Filed: Oct. 11, 2018

(65) Prior Publication Data

US 2019/0052046 A1 Feb. 14, 2019

Related U.S. Application Data

(63) Continuation of application No. PCT/CN2016/079029, filed on Apr. 12, 2016.

(51) Int. Cl.
*H04B 10/50* (2013.01)
*H01S 5/00* (2006.01)
(Continued)

(52) U.S. Cl.
CPC .......... *H01S 5/0085* (2013.01); *G02B 27/283* (2013.01); *G02F 1/01* (2013.01); *H01S 5/0071* (2013.01); *H04B 10/50* (2013.01)

(58) Field of Classification Search
CPC ............ H04B 10/5053; H04B 10/5165; H04B 10/541; H04B 10/54; H04B 10/5561;
(Continued)

(56) References Cited

U.S. PATENT DOCUMENTS 5,745,273 A 4/1998 Jopson
6,424,444 B1 * 7/2002 Kahn ................. H04B 10/5161
398/141
(Continued)

FOREIGN PATENT DOCUMENTS

CN 101155162 A 4/2008
CN 101232330 A 7/2008
(Continued)

OTHER PUBLICATIONS

Ming-Tuo Zhou et al., "Optical Single-Sideband Modulation at 60 GHz Using Electro-Absorption Modulators", 2005 International Topical Meeting on Microwave Photonics, Feb. 13, 2006, 4 pages.

*Primary Examiner* — Tanya T Motsinger

(74) *Attorney, Agent, or Firm* — Womble Bond Dickinson (US) LLP

(57) ABSTRACT

Embodiments of the present application provide an optical signal generation device. The device includes a laser, a first modulator, a second modulator, a first adjustment module, and a beam combiner. The laser is configured to: output a first optical signal to the first modulator, and output a second optical signal to the second modulator. The two modulators are separately configured to: receive an optical signal and a loaded electrical modulation signal, and modulate the optical signal based on the electrical modulation signal, to obtain a first modulated optical signal and a second modulated optical signal. The first adjustment module is further configured to adjust a phase of the modulated optical signal or an optical path to the beam combiner. The beam combiner is configured to: combine the first modulated optical signal obtained after the adjustment and the second modulated optical signal, and output a combined signal.

9 Claims, 5 Drawing Sheets

(51) Int. Cl.
*G02F 1/01* (2006.01)
*G02B 27/28* (2006.01)

(58) Field of Classification Search
CPC ....... H04B 10/50; H04B 10/532; G02F 1/225; G02F 1/01; G02B 2006/12121; G02B 2006/12142; G02B 27/283; G02B 6/12002; G02B 6/12004; G02B 6/126
See application file for complete search history.

(56) References Cited

U.S. PATENT DOCUMENTS

| | | | | |
|---|---|---|---|---|
| 6,490,069 | B1* | 12/2002 | Kahn | H04B 10/25137 398/183 |
| 9,998,228 | B1* | 6/2018 | Wang | H04B 10/50575 |
| 10,078,232 | B1* | 9/2018 | Vermeulen | H04B 10/516 |
| 10,411,807 | B1* | 9/2019 | Earnshaw | H04B 10/541 |
| 2004/0208436 | A1* | 10/2004 | Hakimi | G02B 6/272 385/27 |
| 2005/0141642 | A1* | 6/2005 | Asami | H03H 17/0211 375/316 |
| 2007/0177882 | A1* | 8/2007 | Akiyama | G02F 1/2255 398/185 |
| 2008/0080859 | A1* | 4/2008 | Kagawa | H04B 10/50575 398/42 |
| 2008/0181620 | A1* | 7/2008 | Sasaki | H04B 10/5561 398/198 |
| 2009/0220030 | A1* | 9/2009 | Uhl | H04L 27/20 375/329 |
| 2009/0274469 | A1* | 11/2009 | Yuki | H04B 10/5053 398/152 |
| 2012/0002978 | A1* | 1/2012 | Healey | H04B 10/5165 398/183 |
| 2012/0301153 | A1* | 11/2012 | Takeguchi | G02F 1/225 398/135 |
| 2012/0314277 | A1* | 12/2012 | Matsuda | G02F 1/225 359/341.1 |
| 2013/0108277 | A1* | 5/2013 | Liu | H04B 10/5053 398/184 |
| 2013/0208335 | A1* | 8/2013 | Gottwald | G02F 1/01 359/279 |
| 2013/0322809 | A1* | 12/2013 | Goh | H04B 10/5053 385/3 |
| 2014/0035693 | A1* | 2/2014 | Li | H03C 5/00 332/103 |
| 2014/0133860 | A1* | 5/2014 | Olsson | H04B 10/5053 398/76 |
| 2014/0307996 | A1* | 10/2014 | Kono | G02F 1/2255 385/3 |
| 2015/0071641 | A1* | 3/2015 | Wen | H04B 10/541 398/98 |
| 2015/0104192 | A1* | 4/2015 | Huang | H04B 10/541 398/186 |
| 2015/0311976 | A1 | 10/2015 | Ishizaka | |
| 2016/0119057 | A1* | 4/2016 | Mekis | H04B 10/40 398/51 |
| 2016/0218811 | A1* | 7/2016 | Chen | H04B 10/5561 |
| 2017/0026133 | A1* | 1/2017 | Antona | H04B 10/54 |
| 2017/0082801 | A1* | 3/2017 | Welch | H04B 10/40 |
| 2017/0250758 | A1* | 8/2017 | Kikuchi | H04B 10/2513 |
| 2018/0292607 | A1* | 10/2018 | Dong | G02B 6/126 |
| 2019/0052046 | A1* | 2/2019 | Wang | H01S 5/0085 |
| 2019/0149243 | A1* | 5/2019 | Lee | H04B 10/90 398/76 |
| 2019/0165862 | A1* | 5/2019 | Hayashi | H04B 10/5161 |
| 2019/0229810 | A1* | 7/2019 | Hayashi | H04B 10/073 |

FOREIGN PATENT DOCUMENTS

| | | |
|---|---|---|
| CN | 101527422 A | 9/2009 |
| CN | 102819120 A | 12/2012 |
| CN | 104218998 A | 12/2014 |
| CN | 102356572 B | 3/2015 |
| CN | 104702339 A | 6/2015 |

* cited by examiner

US 10,763,637 B2

OPTICAL SIGNAL GENERATION DEVICE AND METHOD AND CHIP

CROSS-REFERENCE TO RELATED APPLICATIONS

This application is a continuation of International Application No. PCT/CN2016/079029, filed on Apr. 12, 2016, the disclosure of which is hereby incorporated by reference in its entirety.

TECHNICAL FIELD

Embodiments of the present application relate to the optical communications field, and more specifically, to an optical signal generation device and method, and a chip.

BACKGROUND

With emergence of data centers and big data applications, large-capacity and short-distance interconnection becomes an important application scenario. This application addresses a new requirement for a system, particularly for lower device costs, a longer transmission distance, and a larger transmission capacity.

An existing high-speed optical signal transmitter may use a plurality of optical devices, for example, an external light source, a beam splitter, and a beam combiner, to generate a single sideband (SSB) modulation symbol, a multi-level pulse-amplitude modulation (PAM) signal, a multi-symbol quadrature amplitude modulation (QAM) signal, and the like. For example, in a conventional implementation, an SSB signal or a multi-level QAM signal may be generated by passing an external light source through a beam splitter, two modulators, a phase control area, an optical synthesizer, and the like. This implementation requires an integrated in-phase quadrature (IQ) modulator to modulate a phase and the like. For another example, in a conventional implementation, a non-return-to-zero (NRZ) code modulation signal or a multi-level PAM signal may be generated by using an electro-absorption modulated laser (EMI), a directly modulated laser (DML), or the like. However, the multi-level PAM signal has a relatively high linearity requirement for a device. In these conventional methods, the use of an IQ modulator or a growing linearity requirement for a device addresses a relatively high requirement for the device, and costs of the entire device are relatively high.

SUMMARY

Embodiments of the present application provide an optical signal generation device and method, and a chip, so as to reduce costs of the optical signal generation device.

According to a first aspect, an optical signal generation device is provided, including: a laser, a first modulator, a second modulator, a first adjustment module, and a beam combiner, where two ends of the laser are respectively connected to the first modulator and the second modulator, the first modulator is connected to the first adjustment module, and two ends of the beam combiner are respectively connected to the first adjustment module and the second modulator; the laser is configured to: output a first channel of optical signal to the first modulator, and output a second channel of optical signal to the second modulator; the first modulator is configured to: receive the first channel of optical signal and a loaded first channel of electrical modulation signal, and modulate the first channel of optical signal based on the first channel of electrical modulation signal to obtain a first channel of modulated optical signal; the second modulator is configured to: receive the second channel of optical signal and a loaded second channel of electrical modulation signal, and modulate the second channel of optical signal based on the second channel of electrical modulation signal to obtain a second channel of modulated optical signal; the first adjustment module is configured to adjust a phase of the first channel of modulated optical signal or an optical path along which the first channel of modulated optical signal arrives at the beam combiner; and the beam combiner is configured to: combine the second channel of modulated optical signal and the first channel of modulated optical signal that is obtained after the phase adjustment or the optical path adjustment, to obtain a combined signal, and output the combined signal.

According to this embodiment of the present application, the optical signals are respectively output from the two ends of the laser that emits light at both ends, and are modulated by the modulators at the two ends; then the adjustment module adjusts the phase of the modulated optical signal or the optical path along which the modulated optical signal arrives at the beam combiner; and finally, the beam combiner combines the optical signals at the two ends and outputs the combined signal. In this way, costs of the optical signal generation device can be reduced.

The laser in this embodiment of the present application features emitting light at both ends. Compared with a conventional method in which a beam splitter is used, no beam splitter is required to split light into two beams in this embodiment. Therefore, complexity of the device can be reduced.

With reference to the first aspect, in an implementation of the first aspect, the device further includes a second adjustment module, and the second adjustment module is configured to adjust a phase of the second channel of modulated optical signal or an optical path along which the second channel of modulated optical signal arrives at the beam combiner.

The adjustment module may enable a phase difference or an optical path difference between the two channels of modulated optical signals to be a specified preset value by adjusting a phase or an optical path. The device may include one adjustment module that adjusts a phase or an optical path of only one channel of optical signal, or may include two adjustment modules that respectively adjust phases or optical paths of the two channels of optical signals. The adjustment of a phase or an optical path by the adjustment module can improve a signal combination effect. When the device includes two adjustment modules, signal combination precision can be further improved.

With reference to the first aspect and the foregoing implementation, in another implementation of the first aspect, one of the first channel of electrical modulation signal and the second channel of electrical modulation signal is an original electrical modulation signal, and the other is an electrical modulation signal obtained after Hilbert transform is performed on the original electrical modulation signal; and a phase difference between the first channel of modulated optical signal and the second channel of modulated optical signal is $$\frac{\pi}{2} + N*2\pi$$

after the phase adjustment, the combined signal is a single sideband SSB signal, and N is a positive integer.

With reference to the first aspect and the foregoing implementations, in another implementation of the first aspect, the device further includes a polarization rotator; and the polarization rotator is configured to rotate a polarization state of the first channel of modulated optical signal or a polarization state of the second channel of modulated optical signal by 90 degrees plus an integer multiple of 360 degrees.

For example, the polarization rotator rotates a polarization state of one channel of modulated optical signal by 90 degrees plus an integer multiple of 360 degrees and does not change a polarization state of the other channel of modulated optical signal, so that polarization states of the two channels of modulated optical signals are perpendicular.

In this embodiment of the present application, alternatively, the device may include two polarization rotators. One polarization rotator rotates the polarization state of the first channel of modulated optical signal by a first angle and the other polarization rotator rotates the polarization state of the second channel of modulated optical signal by a second angle. A sum of the first angle and the second angle is 90 degrees plus an integer multiple of 360 degrees. In other words, polarization states of the two channels of modulated optical signals are perpendicular.

With reference to the first aspect and the foregoing implementations, in another implementation of the first aspect, the first channel of electrical modulation signal is an N-level pulse-amplitude modulation PAM-N signal, the second channel of electrical modulation signal is a PAM-M signal, and the combined signal is a PAM-M*N signal; and an optical path difference between the first channel of modulated optical signal and the second channel of modulated optical signal is a preset value after the optical path adjustment.

The preset value in this embodiment of the present application may be zero or a value within a specific range near zero, and a specific deviation is allowed.

Generating the PAM-M*N signal according to this embodiment of the present application may avoid a device linearity problem in the prior art. For example, in the generation of the PAM-4 signal, a multi-level signal is broken down into 2-level signals, and no linearity requirement is addressed for the device. In this way, signal quality can be improved, integration is high in this implementation, and a plurality of signals can be generated by using a single chip.

With reference to the first aspect and the foregoing implementations, in another implementation of the first aspect, the first channel of electrical modulation signal is a PAM-N signal, the second channel of electrical modulation signal is a PAM-M signal, a phase difference between the first channel of modulated optical signal and the second channel of modulated optical signal is $$\frac{\pi}{2} + N * 2\pi$$

after the phase adjustment, and the combined signal is an M*N-QAM signal.

The device in this embodiment of the present application may output the M*N-QAM signal, for example, output a 16-QAM signal. In a conventional implementation, an external light source and a Mach-Zehnder modulator (MZM) or an IQ modulator are used, and a chip is relatively large and difficult to be integrated, and has relatively high power consumption. However, the device in this embodiment of the present application has simple integration and a compact chip structure. The device in this embodiment of the present application can greatly reduce complexity of a chip and lower costs of the chip.

In an embodiment of the present application, the adjustment module may adjust a phase difference or an optical path difference between the two channels of modulated optical signals through electrical injection or thermal tuning.

The adjustment module in this embodiment of the present application may adjust a phase and optical paths along which different optical signals arrive at the beam combiner in an integrated manner, or may use a discrete device to separately implement the phase and optical path adjustment. If optical paths along which different optical signals arrive at the beam combiner are different, time periods required by the different optical signals to arrive at the beam combiner are also different.

The optical signal generation device in this embodiment of the present application may be integrated into one chip for implementation. To be specific, all components such as the laser, the modulator, and the adjustment module are integrated into one chip. Alternatively, all components such as the laser, the modulator, and the adjustment module may be implemented by discrete chips or devices.

According to a second aspect, a chip is provided. The chip includes the optical signal generation device according to any one of the implementations of the first aspect.

The chip provided in this embodiment of the present application includes all the components of the optical signal generation device in the first aspect. Compared with a conventional optical signal generation device, a chip structure is compact, and an MZM or an IQ modulator is no longer required, and therefore, a structure of the device is miniaturized.

With reference to the second aspect, in an implementation of the second aspect, the device includes a laser, a first modulator, a second modulator, a first adjustment module, and a beam combiner; two ends of the laser are respectively connected to the first modulator and the second modulator, the first modulator is connected to the first adjustment module, and two ends of the beam combiner are respectively connected to the first adjustment module and the second modulator; the laser is configured to: output a first channel of optical signal to the first modulator, and output a second channel of optical signal to the second modulator; the first modulator is configured to: receive the first channel of optical signal and a loaded first channel of electrical modulation signal, and modulate the first channel of optical signal based on the first channel of electrical modulation signal to obtain a first channel of modulated optical signal; the second modulator is configured to: receive the second channel of optical signal and a loaded second channel of electrical modulation signal, and modulate the second channel of optical signal based on the second channel of electrical modulation signal to obtain a second channel of modulated optical signal; the first adjustment module is configured to adjust a phase of the first channel of modulated optical signal or an optical path along which the first channel of modulated optical signal arrives at the beam combiner; and the beam combiner is configured to: combine the second channel of modulated optical signal and the first channel of modulated optical signal that is obtained after the phase adjustment or the optical path adjustment, to obtain a combined signal, and output the combined signal.

With reference to the second aspect and the foregoing implementation, in another implementation of the second aspect, the device further includes a second adjustment module, and the second adjustment module is configured to adjust a phase of the second channel of modulated optical signal or an optical path along which the second channel of modulated optical signal arrives at the beam combiner.

With reference to the second aspect and the foregoing implementations, in another implementation of the second aspect, one of the first channel of electrical modulation signal and the second channel of electrical modulation signal is an original electrical modulation signal, and the other is an electrical modulation signal obtained after Hilbert transform is performed on the original electrical modulation signal; and a phase difference between the first channel of modulated optical signal and the second channel of modulated optical signal is $$\frac{\pi}{2} + N*2\pi$$

after the phase adjustment, the combined signal is a single sideband SSB signal, and N is a positive integer.

With reference to the second aspect and the foregoing implementations, in another implementation of the second aspect, the device further includes a polarization rotator; and the polarization rotator is configured to rotate a polarization state of the first channel of modulated optical signal or a polarization state of the second channel of modulated optical signal by 90 degrees plus an integer multiple of 360 degrees.

With reference to the second aspect and the foregoing implementations, in another implementation of the second aspect, the first channel of electrical modulation signal is an N-level pulse-amplitude modulation (PAM-N) signal, the second channel of electrical modulation signal is a PAM-M signal, and the combined signal is a PAM-M*N signal; and an optical path difference between the first channel of modulated optical signal and the second channel of modulated optical signal is a preset value after the optical path adjustment.

With reference to the second aspect and the foregoing implementations, in another implementation of the second aspect, the first channel of electrical modulation signal is a PAM-N signal, the second channel of electrical modulation signal is a PAM-M signal, a phase difference between the first channel of modulated optical signal and the second channel of modulated optical signal is $$\frac{\pi}{2} + N*2\pi$$

after the phase adjustment, and the combined signal is an M*N-QAM signal.

For functions of the devices and/or the units of the chip provided in the second aspect, refer to the functions of the modules and/or the units of the optical signal generation device provided in the first aspect. The functions are not repeated herein to avoid repetition.

According to a third aspect, an optical signal generation method is provided. The method is executed by an optical signal generation device, and the device includes a laser, a first modulator, a second modulator, a first adjustment module, and a beam combiner. Two ends of the laser are respectively connected to the first modulator and the second modulator, the first modulator is connected to the first adjustment module, and two ends of the beam combiner are respectively connected to the first adjustment module and the second modulator. The method includes: outputting, by the laser, a first channel of optical signal to the first modulator, and outputting a second channel of optical signal to the second modulator; receiving, by the first modulator, the first channel of optical signal and a loaded first channel of electrical modulation signal, and modulating the first channel of optical signal based on the first channel of electrical modulation signal to obtain a first channel of modulated optical signal; receiving, by the second modulator, the second channel of optical signal and a loaded second channel of electrical modulation signal, and modulating the second channel of optical signal based on the second channel of electrical modulation signal to obtain a second channel of modulated optical signal; adjusting, by the first adjustment module, a phase of the first channel of modulated optical signal or an optical path along which the first channel of modulated optical signal arrives at the beam combiner; and combining, by the beam combiner, the second channel of modulated optical signal and the first channel of modulated optical signal that is obtained after the phase adjustment or the optical path adjustment, to obtain a combined signal, and outputting the combined signal.

According to this embodiment of the present application, the optical signals are respectively output from the two ends of the laser that emits light at both ends, and are modulated by the modulators at the two ends; then the adjustment module adjusts the phase of the modulated optical signal or the optical path along which the modulated optical signal arrives at the beam combiner; and finally, the beam combiner combines the optical signals at the two ends and outputs the combined signal. In this way, costs of the optical signal generation device can be reduced.

With reference to the third aspect, in an implementation of the third aspect, the device further includes a second adjustment module, and the method further includes: adjusting, by the second adjustment module, a phase of the second channel of modulated optical signal or an optical path along which the second channel of modulated optical signal arrives at the beam combiner.

With reference to the third aspect and the foregoing implementation, in another implementation of the third aspect, one of the first channel of electrical modulation signal and the second channel of electrical modulation signal is an original electrical modulation signal, and the other is an electrical modulation signal obtained after Hilbert transform is performed on the original electrical modulation signal; and a phase difference between the first channel of modulated optical signal and the second channel of modulated optical signal is $$\frac{\pi}{2} + N*2\pi$$

after the phase adjustment, the combined signal is a single sideband SSB signal, and N is a positive integer.

With reference to the third aspect and the foregoing implementations, in another implementation of the third aspect, the device further includes a polarization rotator; and the method further includes: rotating, by the polarization rotator, a polarization state of the first channel of modulated optical signal or a polarization state of the second channel of modulated optical signal by 90 degrees plus an integer multiple of 360 degrees.

With reference to the third aspect and the foregoing implementations, in another implementation of the third aspect, the first channel of electrical modulation signal is an N-level pulse-amplitude modulation PAM-N signal, the second channel of electrical modulation signal is a PAM-M signal, and the combined signal is a PAM-M*N signal; and an optical path difference between the first channel of modulated optical signal and the second channel of modulated optical signal is a preset value after the optical path adjustment.

With reference to the third aspect and the foregoing implementations, in another implementation of the third aspect, the first channel of electrical modulation signal is a PAM-N signal, the second channel of electrical modulation signal is a PAM-M signal, a phase difference between the first channel of modulated optical signal and the second channel of modulated optical signal is $$\frac{\pi}{2} + N*2\pi$$

after the phase adjustment, and the combined signal is an M*N-QAM signal.

For an execution procedure of each step in the optical signal generation method provided in the third aspect, refer to the functions of the modules and/or the units in the optical signal generation device provided in the first aspect. The execution procedures are not repeated herein to avoid repetition.

BRIEF DESCRIPTION OF DRAWINGS

To describe the technical solutions in the embodiments of the present application more clearly, the following briefly describes the accompanying drawings required for describing the embodiments of the present application. Apparently, the accompanying drawings in the following description show merely some embodiments of the present application, and a person of ordinary skill in the art may still derive other drawings from these accompanying drawings without creative efforts.

DESCRIPTION OF EMBODIMENTS

The following clearly describes the technical solutions in the embodiments of the present application with reference to the accompanying drawings in the embodiments of the present application. Apparently, the described embodiments are a part rather than all of the embodiments of the present application. All other embodiments obtained by a person of ordinary skill in the art based on the embodiments of the present application without creative efforts shall fall within the protection scope of the present application.

The technical solutions of the present application may be applied in a variety of optical communications systems, for example, a plesiochronous digital hierarchy (PDH) optical communications system, a synchronous digital hierarchy (SDH) optical communications system, a dense wavelength division multiplexing (DWDM) optical communications system, and an optical communications system for an all-optical network.

Figure 1:
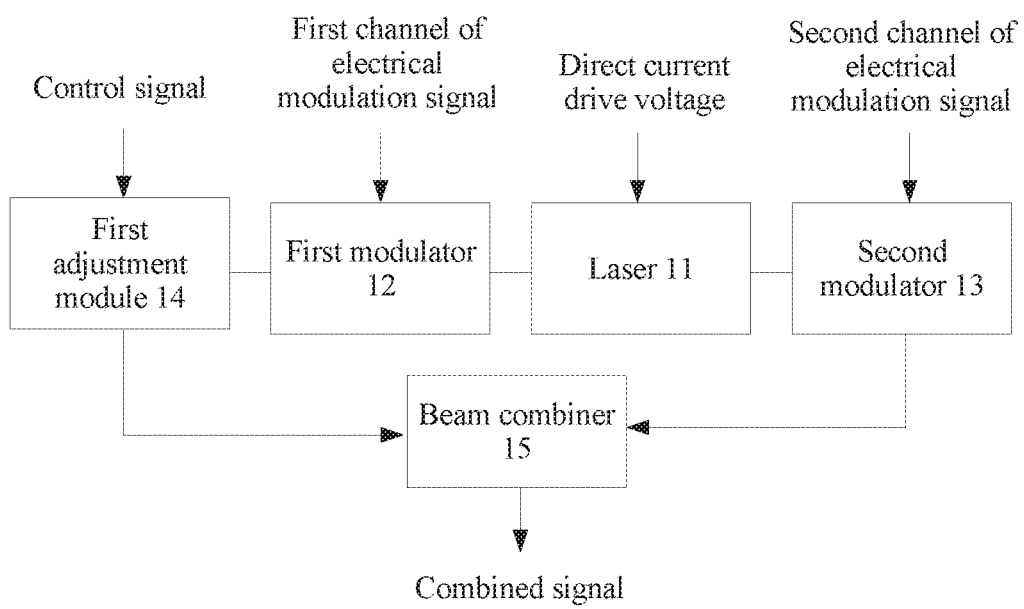
FIG. 1 is a schematic structural diagram of an optical signal generation device according to an embodiment of the present application.

FIG. 1 is a schematic structural diagram of an optical signal generation device according to an embodiment of the present application. The device in FIG. 1 may be a transmitter that generates an optical signal and is configured to transmit the optical signal. The device 10 in FIG. 1 includes a laser 11, a first modulator 12, a second modulator 13, a first adjustment module 14, and a beam combiner 15.

Two ends of the laser 11 are respectively connected to the first modulator 12 and the second modulator 13, the first modulator 12 is connected to the first adjustment module 14, and two ends of the beam combiner 15 are respectively connected to the first adjustment module 14 and the second modulator 13.

The laser 11 is configured to: output a first channel of optical signal to the first modulator 12, and output a second channel of optical signal to the second modulator 13.

The first modulator 12 is configured to: receive the first channel of optical signal and a loaded first channel of electrical modulation signal, and modulate the first channel of optical signal based on the first channel of electrical modulation signal to obtain a first channel of modulated optical signal.

The second modulator 13 is configured to: receive the second channel of optical signal and a loaded second channel of electrical modulation signal, and modulate the second channel of optical signal based on the second channel of electrical modulation signal to obtain a second channel of modulated optical signal.

The first adjustment module 14 is configured to adjust a phase of the first channel of modulated optical signal or an optical path along which the first channel of modulated optical signal arrives at the beam combiner.

The beam combiner 15 is configured to: combine the second channel of modulated optical signal and the first channel of modulated optical signal that is obtained after the phase adjustment or the optical path adjustment, to obtain a combined signal, and output the combined signal.

According to this embodiment of the present application, the optical signals are respectively output from the two ends of the laser that emits light at both ends, and are modulated by the modulators at the two ends; then the adjustment module adjusts the phase of the modulated optical signal or the optical path along which the modulated optical signal arrives at the beam combiner; and finally, the beam combiner combines the optical signals at the two ends and outputs the combined signal. In this way, costs of the optical signal generation device can be reduced.

As a built-in light source of the entire device, the laser in this embodiment of the present application features emitting light at both ends. In this case, the laser may output optical signals to the two ends, and no beam splitter is required to split a light signal into beams. In this way, a structure of the device can be simplified, and the device is miniaturized.

A conventional optical signal generation device usually includes an integrated IQ modulator and needs configurations such as beam splitting, modulation, and beam combination for an optical signal. A structure of such a modulator has high capacity and an extremely high manufacturing requirement, and is difficult to integrate with a light source or the like. Therefore, in a conventional manner, a discrete light source chip and modulator chip are used. This certainly enlarges a chip of the device and increases difficulties in chip miniaturization and integration. In the device in this embodiment of the present application, a light source and a modulator can be easily integrated on a low-cost EML laser manufacturing platform, thereby reducing costs of the device. In addition, a structure of a chip becomes compact, enabling a chip to be miniaturized by dozens of times.

SSB modulation is an amplitude modulation technology that can use electric energy and bandwidth more efficiently. In IQ modulation, data may be split into two channels, and carrier modulation is performed separately on the two channels, and the two channels of carriers are in quadrature with each other. IQ modulation is about a vector direction. In-phase means signals that have a same vector direction. A quadrature component means that vectors of two signals are in quadrature (for example, 90° out of phase). IQ signals mean that one channel is 0° or 180° and the other channel is 90° or 270°, which are referred to as an I channel and a Q channel. They are two channels of quadrature signals.

The laser in this embodiment of the present application may be a distributed feedback (DFB) laser. The DFB laser features emitting light at both ends. Compared with a conventional method in which a beam splitter is used, the DFB laser does not need a beam splitter. Therefore, complexity of the device can be reduced, and the entire device is miniaturized and has a simple structure.

No limitation is imposed on a specific type of the laser in this embodiment of the present application. Any laser that can emit light at both ends may be used as the laser in this embodiment of the present application. For example, the laser in this embodiment of the present application may be a Fabry-Perot (FP) laser.

The laser in this embodiment of the present application may be used as a built-in light source of the entire device structure, and a structure with an external light source in a conventional technology is not used. In this way, integration of the entire device can be improved. To be specific, integration is high in this implementation, and a plurality of signals can be generated by using a single chip.

The modulator (including the first modulator or the second modulator) in this embodiment of the present application is configured to: receive a loaded electrical modulation signal, and modulate an optical signal based on the electrical modulation signal. The modulator in this embodiment of the present application may be an intensity modulator, for example, an electro-absorption modulator (EAM), a Mach-Zehnder modulator (MZM), and a microring modulator.

The modulator may transform a baseband signal into a frequency band signal by loading to-be-transferred information to the baseband signal, so that the obtained frequency band signal is applicable to channel transmission. In this way, impact of interference and noises can be prevented during receiving of a determining result.

The adjustment module in this embodiment of the present application may be configured to adjust a phase or an optical path of an optical signal modulated by a modulator, so that two modulated signals have a preset phase difference or optical path difference. In this way, a function requirement in an actual process that two signals have a specified phase difference or optical path difference can be met.

The adjustment module in this embodiment of the present application may adjust a phase of a modulated optical signal. For example, in FIG. 2 and FIG. 4, during combination of an SSB signal or combination of an M*N-QAM signal, the adjustment module is configured to adjust a phase.

In addition, the adjustment module may further adjust an optical path of a modulated optical signal. For example, in FIG. 3, during combination of a PAM-M*N signal, the adjustment module is configured to adjust an optical path. The fact that the adjustment module may adjust an optical path of a modulated optical signal may be considered as: the adjustment module may adjust a time period required by the modulated optical signal to arrive at the beam combiner. If optical paths along which optical signals arrive at the beam combiner are different, time periods required by the optical signals to arrive at the beam combiner are also different. For example, if the adjustment module enables an optical path difference for two channels of modulated optical signals to be zero, the two channels of modulated optical signals arrive at the beam combiner at the same time.

Figure 2:
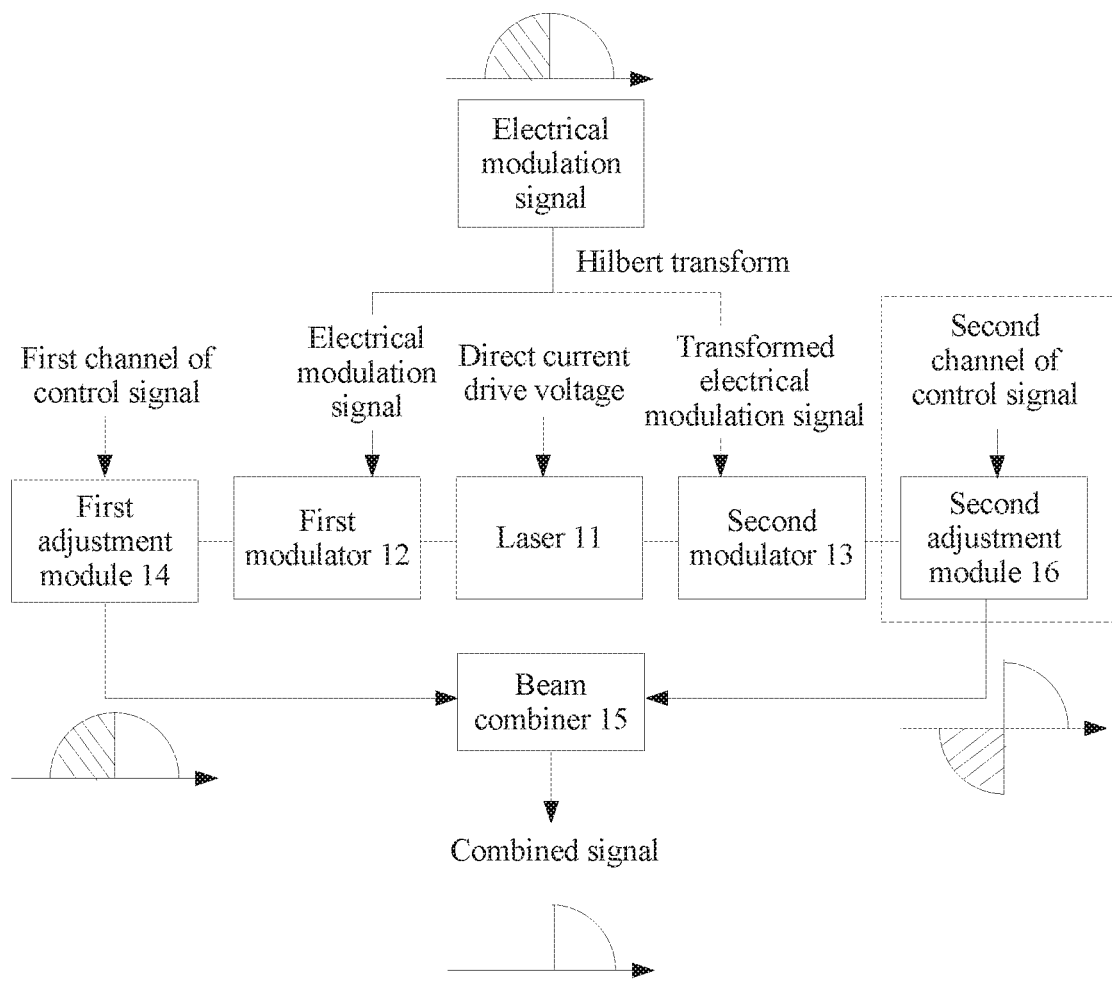
FIG. 2 is a schematic diagram of generating an SSB signal by using a device shown in this figure according to an embodiment of the present application.

One or two adjustment modules may be available in this embodiment of the present application. When one adjustment module is available, the adjustment module may be configured to adjust only a phase of one of the first channel of modulated optical signal and the second channel of modulated optical signal or only an optical path along which one channel of modulated optical signal arrives at the beam combiner. When two adjustment modules are available, each adjustment module may be connected to one modulator, and each adjustment module is configured to adjust an optical path along which one channel of modulated optical signal arrives at the beam combiner. The use of two adjustment modules may achieve a more precise adjustment result and improve efficiency of a phase or optical path adjustment function. In FIG. 1, only one end of one modulator (for example, the first modulator) is connected to one adjustment module (for example, the first adjustment module). In FIG. 2, one end of each modulator is connected to one adjustment module. For example, in FIG. 2, the first modulator 12 is connected to the first adjustment module 14, and the second modulator 13 is connected to the second adjustment module 16.

The adjustment module in this embodiment of the present application may adjust a phase or an optical path of an optical signal in the adjustment module by using a control signal. The control signal may be a direct current signal.

The optical signal generation device in this embodiment of the present application may be a transmitter. This application aims at providing a simple and modularized form of transmitter to satisfy requirements of a plurality of modulation modes, for example, SSB/PAM-N and QAM. In addition, the device or the transmitter in this embodiment of the present application may have a more compact chip structure, so that costs of the device can be reduced.

The following uses an example to describe how the device in this embodiment of the present application generates a variety of optical signals.

FIG. 2 is a schematic diagram of generating an SSB signal by using a device shown in this figure according to an embodiment of the present application. In other words, an output signal in this embodiment of the present application may be an SSB signal. The device in FIG. 2 may include a laser 11, a first modulator 12, a second modulator 13, a first adjustment module 14, and a beam combiner 15. The device in FIG. 2 may further include a second adjustment module 16. The second adjustment module is an optional module.

In this embodiment of the present application, the laser 11 may be a DFB laser, and the first modulator and the second modulator may be EAMs or MZMs. The following provides description by using an example in which the laser is a DFB laser and the modulators are EAMs.

The beam combiner 15 in this embodiment of the present application may be a multimode interference (MMI) coupler.

The laser 11 (for example, a DFB laser) acts as a built-in light source of the entire optical signal generation device. Light may apply a direct current drive voltage on the laser, so that the laser emits optical signals. The optical signals on the laser are output from two ends of the DFB laser respectively and enter a first modulator (for example, an EAM) and a second modulator (for example, an EAM) respectively. The first modulator may receive an optical signal (for example, a first channel of optical signal) sent by the laser, and may further receive an electrical modulation signal (for example, a first channel of electrical modulation signal) from the outside, and modulate the optical signal by using the electrical modulation signal, to obtain a modulated optical signal (for example, a first channel of modulated optical signal). Similarly, the second modulator may also receive an optical signal (for example, a second channel of optical signal) sent by the laser, and may further receive an electrical modulation signal (for example, a second channel of electrical modulation signal) from the outside, and modulate the optical signal by using the electrical modulation signal, to obtain a modulated optical signal (for example, a second channel of modulated optical signal).

In this embodiment of the present application, the first channel of electrical modulation signal entering the first modulator and the second channel of electrical modulation signal entering the second modulator may be obtained from an original electrical modulation signal. Herein, the original electrical modulation signal may be any electrical modulation signal. For example, the original electrical modulation signal may be an NRZ electrical modulation signal, a PAM-4 electrical modulation signal, or a 16-QAM electrical modulation signal. A spectrum of the original electrical modulation signal may be symmetric. As shown in FIG. 2, the original electrical modulation signal is split into two channels. The first channel of electrical modulation signal directly enters the first modulator 12. After Hilbert transform is performed on the second channel of electrical modulation signal, a transformed electrical modulation signal is obtained, and the transformed electrical modulation signal enters the second modulator 13. The two channels of electrical modulation signals are respectively loaded to the modulators at two ends of the laser. The two modulators use their respective loaded electrical modulation signals to respectively modulate the optical signals entering the modulators.

When the device shown in FIG. 2 has only one adjustment module, for example, only the first adjustment module, the original electrical modulation signal passes through the first modulator and then the first adjustment module, and a phase difference between the signals modulated by the two modulators is π/2. Optionally, the phase difference obtained after modulation is performed by the two modulators may also be $$\frac{\pi}{2} + N*2\pi,$$

and N is a positive integer. Finally, the two different beams of optical signals may be combined by using the combiner, and a combined signal is output. In other words, an SSB signal is output.

It should be noted that the phase difference between the two channels of optical signals modulated by the two modulators may be $$\frac{\pi}{2} + N*2\pi.$$

In an embodiment of the present application, only an end of the first modulator is connected to an adjustment module, so that the phase difference between the two channels of modulated optical signals is $$\frac{\pi}{2} + N*2\pi,$$

or only an end of the second modulator is connected to an adjustment module, so that the phase difference between the two channels of modulated optical signals is $$\frac{\pi}{2} + N*2\pi.$$

An only difference between the two implementation solutions is which half sideband signal is reserved.

In another embodiment of the present application, an end of the first modulator may be connected to an adjustment module and an end of the second modulator may be connected to another adjustment module. As shown in FIG. 2, the first modulator 12 is connected to the first adjustment module 14, and the second modulator 13 is connected to the second adjustment module 16. In this case, the first adjustment module and the second adjustment module may jointly function to achieve a phase difference between two channels of modulated optical signals. For example, the first adjustment module and the second adjustment module separately adjust a phase difference between two channels of modulated optical signals:

$$\frac{\pi}{2} + N*2\pi$$

and $$-\frac{\pi}{2} + N*2\pi.$$

In this way, the use of two adjustment modules may achieve a more accurate adjustment result and can improve accuracy of phase adjustment.

Figure 3:
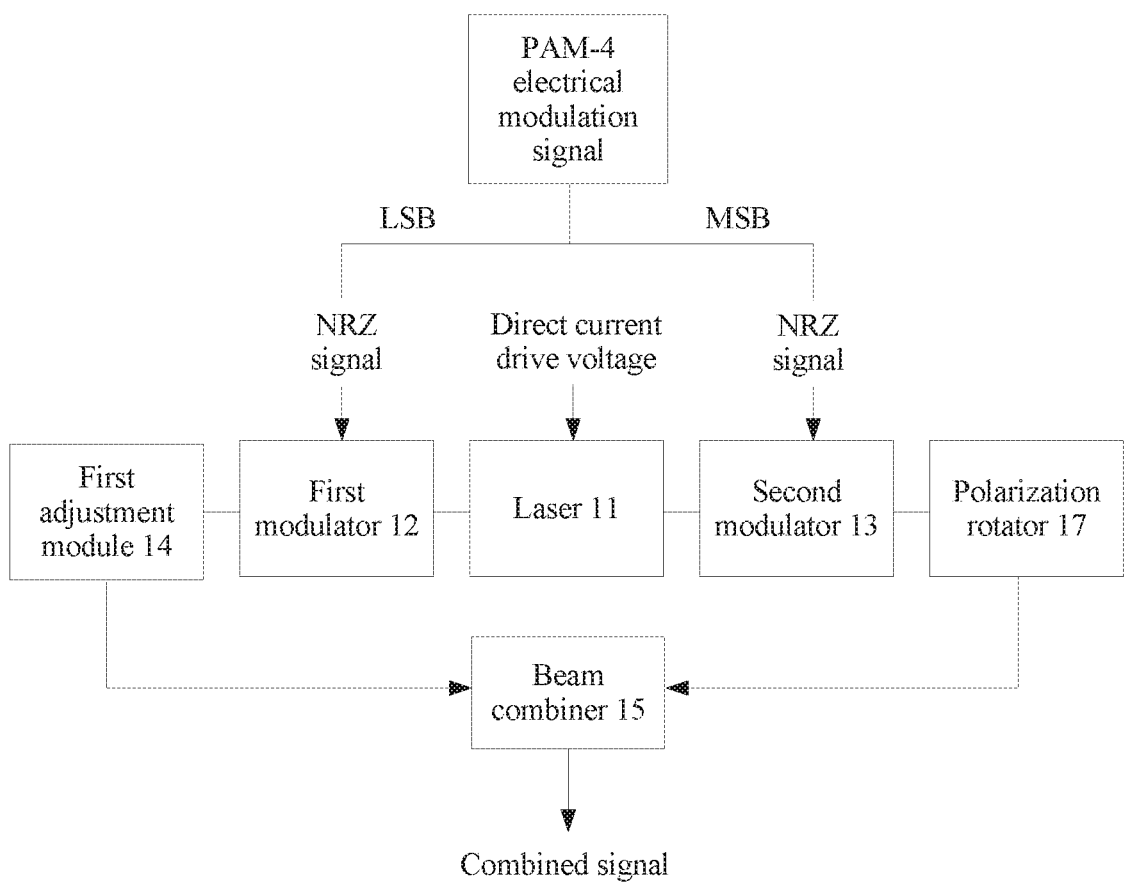
FIG. 3 is a schematic diagram of generating a PAM-N signal by using a device shown in this figure according to an embodiment of the present application.

FIG. 3 is a schematic diagram of generating a PAM-N signal by using a device shown in this figure according to an embodiment of the present application. In other words, an output signal in this embodiment of the present application may be a PAM-N signal. The device in FIG. 3 may include a laser 11, a first modulator 12, a second modulator 13, a first adjustment module 14, a beam combiner 15, and a polarization rotator 17.

In this embodiment of the present application, the laser 11 may be a DFB laser, and the first modulator and the second modulator may be EAMs or MZMs. The following provides description by using an example in which the laser is a DFB laser and the modulators are MZMs.

The beam combiner 15 in this embodiment of the present application may be a polarization beam combiner.

Light is emitted from two ends of the DFB laser and separately passes through an MZM on the left and an MZM on the right. An electrical modulation signal in this embodiment of the present application may be a PAM-4 electrical modulation signal. The electrical modulation signal herein may be obtained by using a circuit. The PAM-4 electrical modulation signal is split into two channels of NRZ signals, which represent least significant bit (LSB) information and most significant bit (MSB) information respectively. The two channels of NRZ signals are respectively loaded to two MZMs, so that signal modulation is performed on corresponding optical signals. A manner of splitting the PAM-4 signal may comply with the prior art. An output optical power of a side representing the least significant bit information is P/2, and an output optical power of a side representing the most significant bit information is P. The modulated optical signal on either of the two sides may be adjusted by the adjustment module in terms of an optical path along which the modulated optical signal arrives at the beam combiner, so that the two channels of modulated optical signals have a preset optical path difference. This method for enabling the optical path difference to be a preset value may be used to make compensation for an optical path deviation caused by an assembly error in an actual assembly process.

The adjustment module in this embodiment of the present application may be configured to adjust an optical path along which the modulated optical signal output by the first modulator arrives at the beam combiner.

In addition, when either of the two channels of modulated optical signals passes through a polarization rotator, a polarization state may be rotated by 90+P*360 degrees to be perpendicular to a polarization state of the other channel of modulated optical signal, where P is an integer. Finally, the two channels of signals output by the adjustment module and the polarization rotator are combined by using the beam combiner and a combined signal is output.

The device in this embodiment of the present application may include one polarization rotator, as shown in FIG. 3. Alternatively, the device may include two polarization rotators. One polarization rotator rotates a polarization state of the first channel of modulated optical signal by a first angle, and the other polarization rotator rotates a polarization state of the second channel of modulated optical signal by a second angle. A sum of the first angle and the second angle is 90 degrees plus an integer multiple of 360 degrees. In other words, the polarization states of the two channels of modulated optical signals are perpendicular.

An output signal in this embodiment of the present application may be a PAM-N signal. For example, when the electrical modulation signal is a PAM-4 signal, signals input into the two modulators are NRZ signals, as marked in FIG. 3. When the electrical modulation signal is a PAM-16 signal, signals input into the two modulators are PAM-4 signals.

In this embodiment of the present application, PAM-N indicates a PAM signal with N level states. For example, a PAM-4 signal may indicate a signal with four level states, and a PAM-8 signal may indicate a signal with eight level states.

Generating the PAM-M*N signal according to this embodiment of the present application may avoid a device linearity problem in the prior art. For example, in the generation of the PAM-4 signal, a multi-level signal is broken down into 2-level signals, and no linearity requirement is addressed for the device. In this way, signal quality can be improved, integration is high in this implementation, and a plurality of signals can be generated by using a single chip.

One or two adjustment modules may be available in this embodiment of the present application. When two adjustment modules are available, each adjustment module is connected to a modulator. One end of an adjustment module is connected to a modulator, and the other end is connected to the polarization rotator. The two adjustment modules may adjust optical paths along which the modulated optical signals arrive at the beam combiner, so as to improve adjustment precision. Alternatively, the two adjustment modules may jointly function to enable the modulated optical signals to have a specified optical path difference, so as to improve optical path adjustment accuracy.

Because an amount of information included in a PAM-4 signal is twice as many as an amount of information included in an NRZ signal, if PAM-4 is used to replace NRZ, an amount of information transmitted at a same signal rate may double, and a signal throughput may increase from an original signal throughput of 100 GbE to 200 GbE. The PAM-4 signal has four levels, which are 16-QAM baseband modulation levels. The PAM-4 signal is widely applied and includes a large amount of information. Therefore, a PAM-4 signal generation process needs to be simple and convenient at low costs. Using the device in this embodiment of the present application to generate a PAM-4 signal meets requirements for low costs and a simple process.

Figure 4:
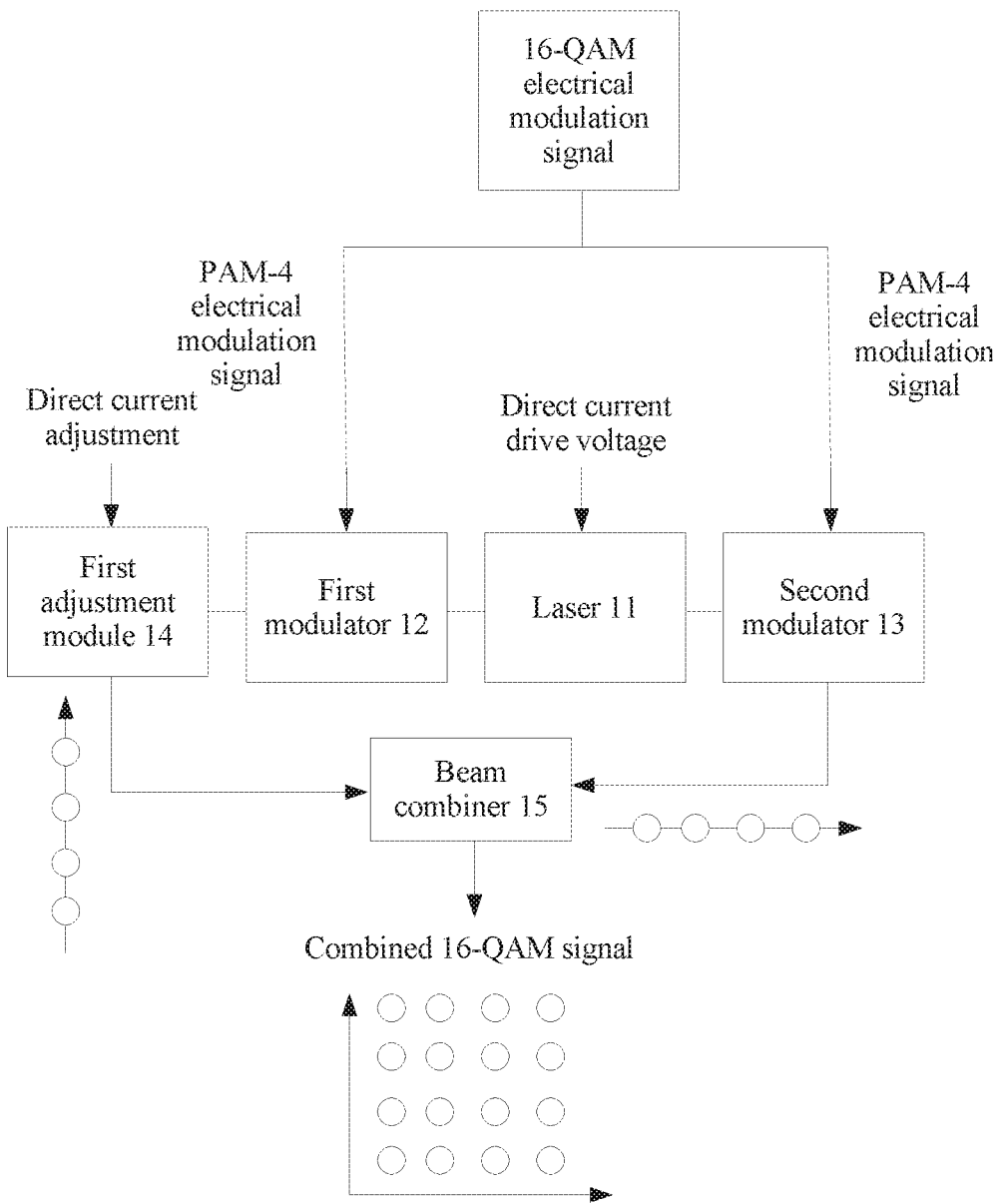
FIG. 4 is a schematic diagram of generating an N*M-QAM signal by using a device shown in this figure according to an embodiment of the present application.

FIG. 4 is a schematic diagram of generating an N*M-QAM signal by using a device shown in this figure according to an embodiment of the present application. In other words, an output signal in this embodiment of the present application may be an M*N-PAM signal. The device in FIG. 3 may include a laser 11, a first modulator 12, a second modulator 13, a first adjustment module 14, and a beam combiner 15.

In this embodiment of the present application, the laser 11 may be a DFB laser, and the first modulator and the second modulator may be EAMs or MZMs. The following provides description by using an example in which the laser is a DFB laser and the modulators are EAMs.

The beam combiner 15 in this embodiment of the present application may be an MMI.

Optical signals are emitted from two ends of the DFB laser and respectively pass through an EAM on the left and an EAM on the right. PAM-4 electrical modulation signals are respectively loaded on the two EAMs, and the optical signals are modulated by the two EAMs by using the electrical modulation signals. One channel of optical signal passes through a $$\frac{\pi}{2} + N * 2\pi$$

adjustment module. Either channel of optical signal may pass through the adjustment module. Then, the beam combiner combines the two channels of optical signals and outputs a combined signal. Because a phase difference of $$\frac{\pi}{2} + N*2\pi$$

exists between the two channels of optical signals, the channels of optical signals are mutually perpendicular on a complex plane. Finally, a 16-QAM signal may be output. Herein, N is a positive integer.

When an output signal is a 16-QAM signal, signals entering the first modulator and the second modulator may both be PAM-4 electrical modulation signals. The two channels of PAM-4 electrical modulation signals may be mutually independent signals, or may be obtained after a 16-QAM electrical modulation signal is split, as shown in FIG. 4.

An output signal in this embodiment of the present application may be an M*N-QAM signal, where N and M are both positive integers. When the electrical modulation signals in the first modulator and the second modulator are respectively a PAM-M electrical modulation signal and a PAM-N electrical modulation signal, a combined signal that is obtained through combination and output by the beam combiner may be an M*N-QAM signal. M*N-QAM signal indicates a QAM signal with M*N symbols. For example, 16-QAM signal indicates a QAM signal with 16 symbols, as shown in the signal diagram drawn in FIG. 4.

The device in this embodiment of the present application may output the M*N-QAM signal, for example, output a 16-QAM signal. In a conventional implementation, an external light source and a Mach-Zehnder modulator (MZM) or an IQ modulator are used, and a chip is relatively large and difficult to be integrated, and has relatively high power consumption. However, the device in this embodiment of the present application has simple integration and a compact chip structure. The device in this embodiment of the present application can greatly reduce complexity of a chip and lower costs of the chip.

In this embodiment of the present application, two adjustment modules may be included. The two adjustment modules jointly function to adjust phases of the modulated signals, or the two adjustment modules adjust phases of the modulated signals. In this way, adjustment precision and flexibility can be improved.

The foregoing describes in detail an optical signal generation device according to the embodiments of the present application with reference to FIG. 1 to FIG. 4. The following describes in detail an optical signal generation method according to an embodiment of the present application with reference to FIG. 5.

Figure 5:
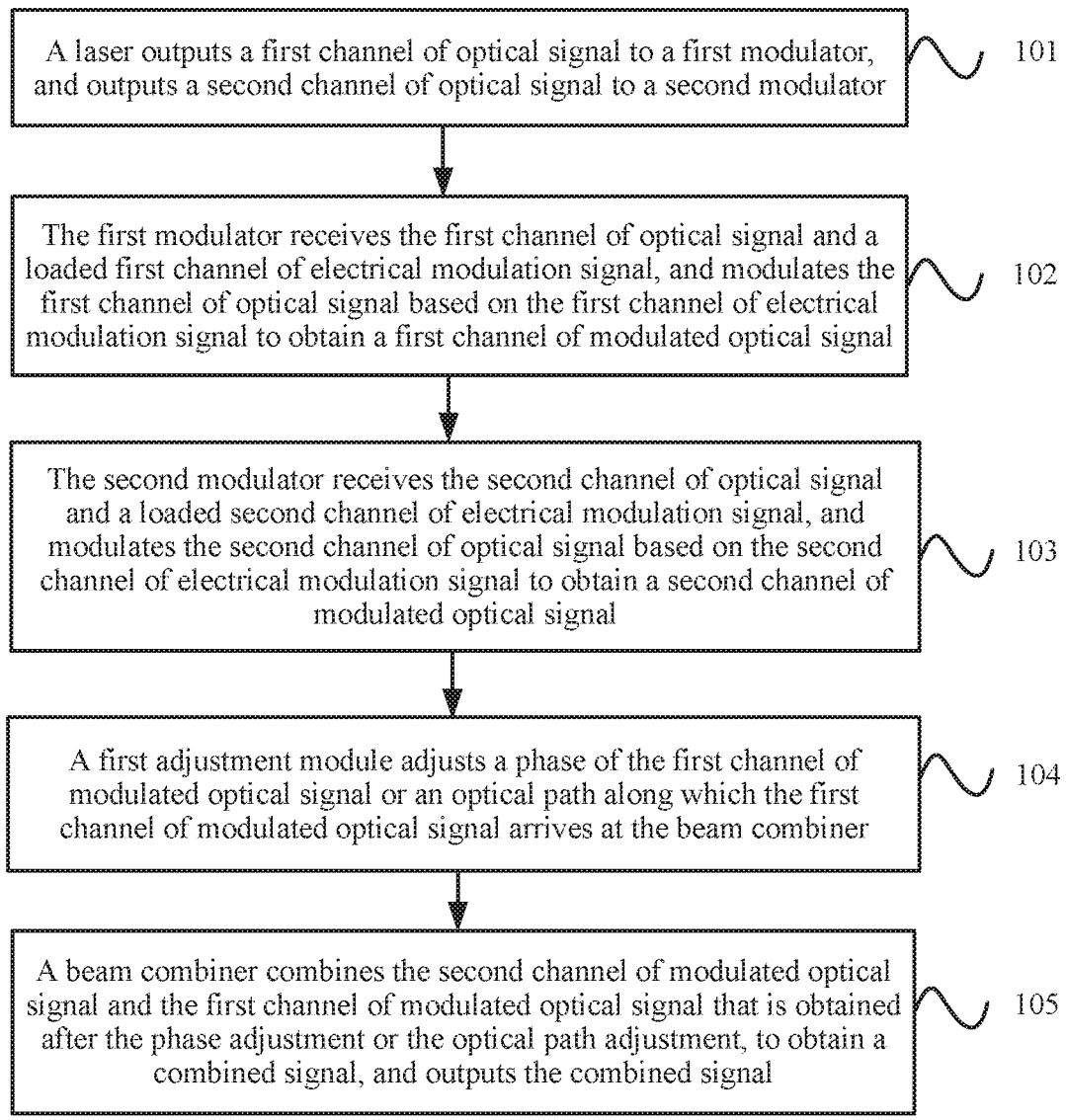
FIG. 5 is a schematic flowchart of an optical signal generation method according to an embodiment of the present application.

FIG. 5 is a schematic flowchart of an optical signal generation method according to an embodiment of the present application. The method shown in FIG. 5 may be executed by an optical signal generation device. The device includes a laser, a first modulator, a second modulator, a first adjustment module, and a beam combiner. Two ends of the laser are respectively connected to the first modulator and the second modulator, the first modulator is connected to the first adjustment module, and two ends of the beam combiner are respectively connected to the first adjustment module and the second modulator.

The optical signal generation method may be executed according to the following procedures:

101. The laser outputs a first channel of optical signal to the first modulator, and outputs a second channel of optical signal to the second modulator.

102. The first modulator receives the first channel of optical signal and a loaded first channel of electrical modulation signal, and modulates the first channel of optical signal based on the first channel of electrical modulation signal to obtain a first channel of modulated optical signal.

103. The second modulator receives the second channel of optical signal and a loaded second channel of electrical modulation signal, and modulates the second channel of optical signal based on the second channel of electrical modulation signal to obtain a second channel of modulated optical signal.

104. The first adjustment module adjusts a phase of the first channel of modulated optical signal or an optical path along which the first channel of modulated optical signal arrives at the beam combiner.

105. The beam combiner combines the second channel of modulated optical signal and the first channel of modulated optical signal that is obtained after the phase adjustment or the optical path adjustment, to obtain a combined signal, and outputs the combined signal.

According to this embodiment of the present application, the optical signals are respectively output from the two ends of the laser that emits light at both ends, and are modulated by the modulators at the two ends; then the adjustment module adjusts the phase of the modulated optical signal or the optical path along which the modulated optical signal arrives at the beam combiner; and finally, the beam combiner combines the optical signals at the two ends and outputs the combined signal. In this way, costs of the optical signal generation device can be reduced.

For an execution procedure of each step in the optical signal generation method according to the embodiment of the present application in FIG. 5, refer to the functions of the modules and/or the units in the optical signal generation device in FIG. 1 to FIG. 4. The execution procedures are not repeated herein to avoid repetition.

It should be noted that the specific examples in the present application are merely used to help a person in the prior art to better understand the embodiments of the present application and do not limit a scope of the embodiments of the present application.

"an embodiment" or "an embodiment" mentioned in the whole specification does not mean that particular features, structures, or characteristics related to the embodiment are included in at least one embodiment of the present application. Therefore, "in an embodiment" or "in an embodiment" appearing throughout the specification does not refer to a same embodiment. In addition, these particular features, structures, or characteristics may be combined in one or more embodiments by using any appropriate manner.

It should be understood that sequence numbers of the foregoing processes do not mean execution sequences in the embodiments of the present application. The execution sequences of the processes should be determined according to functions and internal logic of the processes, and should not be construed as any limitation on the implementation processes of the embodiments of the present application.

It should be understood that in the embodiments of the present application, "B corresponding to A" indicates that B is associated with A, and B may be determined according to A. However, it should further be understood that determining A according to B does not mean that B is determined according to A only; that is, B may also be determined according to A and/or other information.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present application.

It may be clearly understood by a person skilled in the art that, for ease of description and brevity, refer to corresponding description in the foregoing system embodiments for a detailed procedure of the foregoing method, and details are not described herein again.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual requirements to achieve the objectives of the solutions of the embodiments.

In addition, functional units in the embodiments of the present application may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of the present application essentially, or the part contributing to the prior art, or some of the technical solutions may be implemented in a form of a software product. The computer software product is stored in a storage medium, and includes several instructions for instructing a computer device (which may be a personal computer, a server, or a network device) to perform all or some of the steps of the methods described in the embodiments of the present application. The foregoing storage medium includes: any medium that can store program code, such as a USB flash drive, a removable hard disk, a read-only memory (ROM), a random access memory (RAM), a magnetic disk, or an optical disc.

The foregoing descriptions are merely specific implementations of the present application, but are not intended to limit the protection scope of the present application. Any variation or replacement readily figured out by a person skilled in the art within the technical scope disclosed in the present application shall fall within the protection scope of the present application. Therefore, the protection scope of the present application shall be subject to the protection scope of the claims.

What is claimed is:

1. An optical signal generation device, comprising:
   a laser configured to output a first optical signal and output a second optical signal;
   a first modulator connected to the laser and configured to receive the first optical signal and a loaded first electrical modulation signal, and modulate the first optical signal based on the first electrical modulation signal to obtain a first modulated optical signal;
   a second modulator connected to the laser and configured to receive the second optical signal and a loaded second electrical modulation signal, and modulate the second optical signal based on the second electrical modulation signal to obtain a second modulated optical signal;
   a first adjustment module connected to the first modulator and configured to adjust a phase of the first modulated optical signal or an optical path along which the first modulated optical signal travels; and
   a beam combiner connected to the adjustment module and the second modulator, and configured to combine the second modulated optical signal and the first modulated optical signal that is obtained after the phase adjustment or the optical path adjustment into a combined signal, and output the combined signal, wherein the first electrical modulation signal is an N-level pulse-amplitude modulation (PAM-N) signal, the second electrical modulation signal is an M-level pulse-amplitude modulation (PAM-M) signal, and wherein:
   the combined signal is a PAM-M*N signal, and an optical path difference between the first modulated optical signal and the second modulated optical signal is a preset value after the optical path adjustment; or
   a phase difference between the first modulated optical signal and the second modulated optical signal is $$\frac{\pi}{2} + N*2\pi$$

after the phase adjustment, and the combined signal is an M*N-level quadrature amplitude modulation (M*N-QAM) signal.

2. The device according to claim 1, further comprising:
   a second adjustment module configured to adjust a phase of the second modulated optical signal or an optical path along which the second modulated optical signal travels.

3. The device according to claim 1, further comprising:
   a polarization rotator configured to rotate a polarization state of the first modulated optical signal or a polarization state of the second modulated optical signal by 90 degrees plus an integer multiple of 360 degrees.

4. An integrated circuit (IC) chip, comprising:
   an optical signal generation device, comprising:
   a laser configured to output a first optical signal and output a second optical signal;
   a first modulator connected to the laser and configured to receive the first optical signal and a loaded first electrical modulation signal, and modulate the first optical signal based on the first electrical modulation signal to obtain a first modulated optical signal;
   a second modulator connected to the laser and configured to receive the second optical signal and a loaded second electrical modulation signal, and modulate the second optical signal based on the second electrical modulation signal to obtain a second modulated optical signal;

a first adjustment module connected to the first modulator and configured to adjust a phase of the first modulated optical signal or an optical path along which the first modulated optical signal travels; and a beam combiner connected to the adjustment module and the second modulator, and configured to combine the second modulated optical signal and the first modulated optical signal that is obtained after the phase adjustment or the optical path adjustment into a combined signal, and output the combined signal, wherein the first electrical modulation signal is an N-level pulse-amplitude modulation (PAM-N) signal, the second electrical modulation signal is an M-level pulse amplitude modulation (PAM-M) signal, and wherein:

the combined signal is a PAM-M*N signal; and an optical path difference between the first modulated optical signal and the second modulated optical signal is a preset value after the optical path adjustment; or a phase difference between the first modulated optical signal and the second modulated optical signal is $$\frac{\pi}{2} + N * 2\pi$$

after the phase adjustment, and the combined signal is an M*N-level quadrature amplitude modulation (M*N-QAM) signal.

5. The IC chip according to claim 4, wherein the optical signal generation device further comprises a second adjustment module configured to adjust a phase of the second modulated optical signal or an optical path along which the second modulated optical signal arrives at the beam combiner.

6. The IC chip according to claim 4, wherein the optical signal generation device further comprises a polarization rotator configured to rotate a polarization state of the first modulated optical signal or a polarization state of the second modulated optical signal by 90 degrees plus an integer multiple of 360 degrees.

7. An optical signal generation method, comprising:
outputting, by a laser, a first optical signal to a first modulator and a second optical signal to a second modulator;
receiving, by the first modulator, the first optical signal and a loaded first electrical modulation signal, and modulating the first optical signal based on the first electrical modulation signal to obtain a first modulated optical signal;
receiving, by the second modulator, the second optical signal and a loaded second electrical modulation signal, and modulating the second optical signal based on the second electrical modulation signal to obtain a second modulated optical signal;
adjusting, by a first adjustment module, a phase of the first modulated optical signal or an optical path along which the first modulated optical signal travels; and
combining, by the beam combiner, the second modulated optical signal and the first modulated optical signal that is obtained after the phase adjustment or the optical path adjustment, into a combined signal, and outputting the combined signal, wherein the first electrical modulation signal is an N-level pulse-amplitude modulation (PAM-N) signal, the second electrical modulation signal is an M-level pulse-amplitude modulation (PAM-M) signal, and wherein:

the combined signal is a PAM-M*N signal; and an optical path difference between the first modulated optical signal and the second modulated optical signal is a preset value after the optical path adjustment; or a phase difference between the first modulated optical signal and the second modulated optical signal is $$\frac{\pi}{2} + N * 2\pi$$

after the phase adjustment, and the combined signal is an M*N-level quadrature amplitude modulation (M*N-QAM) signal.

8. The method according to claim 7, further comprising:
adjusting, by a second adjustment module, a phase of the second modulated optical signal or an optical path along which the second modulated optical signal travels.

9. The method according to claim 7, further comprising:
rotating, by a polarization rotator, a polarization state of the first modulated optical signal or a polarization state of the second modulated optical signal by 90 degrees plus an integer multiple of 360 degrees.

* * * * *